United States Patent
Cheng et al.

(10) Patent No.: US 11,422,040 B2
(45) Date of Patent: Aug. 23, 2022

(54) TEMPERATURE DETECTION CIRCUIT, DISPLAY PANEL AND DISPLAY DEVICE

(71) Applicant: BOE TECHNOLOGY GROUP CO., LTD., Beijing (CN)

(72) Inventors: Chih Jen Cheng, Beijing (CN); Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 966 days.

(21) Appl. No.: 15/779,357

(22) PCT Filed: Sep. 20, 2017

(86) PCT No.: PCT/CN2017/102409
§ 371 (c)(1),
(2) Date: May 25, 2018

(87) PCT Pub. No.: WO2018/153075
PCT Pub. Date: Aug. 30, 2018

(65) Prior Publication Data
US 2021/0164844 A1    Jun. 3, 2021

(30) Foreign Application Priority Data
Feb. 27, 2017  (CN) .......................... 201710109490.2

(51) Int. Cl.
*G01K 7/00* (2006.01)
*G01K 7/01* (2006.01)
(Continued)

(52) U.S. Cl.
CPC .............. *G01K 7/01* (2013.01); *G09G 3/006* (2013.01); *G09G 2320/041* (2013.01); *H01L 23/34* (2013.01)

(58) Field of Classification Search
CPC .... H03K 5/133; H03K 3/0315; H03L 7/0995; G01K 2219/00; G01K 7/00; G01K 7/01;
(Continued)

(56) References Cited

U.S. PATENT DOCUMENTS

| | | | | |
|---|---|---|---|---|
| 4,517,532 A | * | 5/1985 | Neidorff | H03K 3/0315 331/108 C |
| 5,418,499 A | * | 5/1995 | Nakao | H03K 3/0315 331/177 R |

(Continued)

FOREIGN PATENT DOCUMENTS

| | | |
|---|---|---|
| CN | 1527386 A | 9/2004 |
| CN | 101409541 A | 4/2009 |

(Continued)

OTHER PUBLICATIONS

JP2000009547A, Translation, Jan. 2000.*
(Continued)

*Primary Examiner* — Gail Kaplan Verbitsky
(74) *Attorney, Agent, or Firm* — Calfee, Halter & Griswold LLP

(57) ABSTRACT

The present disclosure relates to a temperature detection circuit, a display panel, and a display device. The temperature detection circuit includes: an odd number of inverters coupled end to end in series to form a loop; and a plurality of switches, two terminals of each of which correspondingly coupled to two terminals of an even number of inverters, which are coupled continuously, among the odd number of inverters.

18 Claims, 3 Drawing Sheets

(51) Int. Cl.
*G09G 3/00* (2006.01)
*H01L 23/34* (2006.01)

(58) Field of Classification Search
CPC .......... G01K 7/346; G01K 7/32; G01K 13/00; G09G 3/006; G09G 2329/041; H01L 23/34
USPC .................................. 374/178, 170; 331/57
See application file for complete search history.

(56) References Cited

U.S. PATENT DOCUMENTS

| | | | | |
|---|---|---|---|---|
| 5,689,213 | A * | 11/1997 | Sher | G11C 11/406 327/276 |
| H1744 | H | 8/1998 | Clayton et al. | |
| 5,815,043 | A * | 9/1998 | Chow | H03K 3/0315 331/108 C |
| 6,188,252 | B1 * | 2/2001 | Kawakami | H03L 7/0995 327/101 |
| 6,310,506 | B1 * | 10/2001 | Brown | G11C 7/1045 327/284 |
| 7,093,975 | B2 * | 8/2006 | Sengoku | G01K 7/01 374/170 |
| 7,215,212 | B2 * | 5/2007 | Mahony | G01K 7/01 331/179 |
| 10,198,990 | B2 * | 2/2019 | Tong | G09G 3/3225 |
| 10,680,585 | B2 * | 6/2020 | Aouini | H03L 7/083 |
| 10,727,819 | B2 * | 7/2020 | Toyama | H03K 5/04 |
| 11,156,505 | B2 * | 10/2021 | Tang | G01K 7/00 |
| 2004/0174923 | A1 | 9/2004 | Sengoku et al. | |
| 2005/0225415 | A1 | 10/2005 | Mahony et al. | |
| 2006/0022729 | A1 * | 2/2006 | Carley | G06F 1/025 327/164 |
| 2008/0143407 | A1 * | 6/2008 | Schrom | H04L 25/4902 327/172 |
| 2008/0258824 | A1 * | 10/2008 | Goff | H03K 3/0315 331/57 |
| 2010/0109786 | A1 * | 5/2010 | Maeda | H03L 7/0995 331/25 |
| 2011/0037502 | A1 * | 2/2011 | Nakano | H03K 3/0322 327/105 |
| 2015/0137896 | A1 * | 5/2015 | Gajda | H03K 3/0315 331/57 |
| 2016/0266552 | A1 * | 9/2016 | Shimada | G04F 10/04 |
| 2017/0038264 | A1 | 2/2017 | Odedara | |
| 2021/0048860 | A1 * | 2/2021 | Jinta | G06F 1/206 |

FOREIGN PATENT DOCUMENTS

| | | | | |
|---|---|---|---|---|
| CN | 103248319 | A | | 8/2013 |
| CN | 105391429 | A | | 3/2016 |
| CN | 105469755 | A | | 4/2016 |
| CN | 106023890 | A | | 10/2016 |
| CN | 106840432 | A * | 6/2017 | ............. G01K 7/00 |
| CN | 106875878 | A | | 6/2017 |
| DE | 4342458 | C2 * | 7/2002 | ............. G11C 5/147 |
| JP | H05136657 | A * | 5/1993 | |
| JP | H07249739 | A | | 9/1995 |
| JP | 2000009547 | A * | 1/2000 | |
| JP | 2005018251 | A * | 1/2005 | ............. G06F 7/588 |
| KR | 102345861 | B1 * | 12/2021 | |

OTHER PUBLICATIONS

Search Report and Written Opinion for International Application No. PCT/CN2017/102409 dated Jan. 3, 2018.
First Office Action for Chinese Patent Application No. 20170109490.2 dated Apr. 22, 2019.

* cited by examiner

TEMPERATURE DETECTION CIRCUIT, DISPLAY PANEL AND DISPLAY DEVICE

CROSS-REFERENCE TO RELATED APPLICATIONS

This application is based upon International Application No. PCT/CN2017/102409, filed on Sep. 20, 2017, which is based upon and claims priority to Chinese patent application No. 201710109490.2 filed on Feb. 27, 2017, the entire contents of which are hereby incorporated by reference.

TECHNICAL FIELD

The present disclosure relates to the field of display technology, and in particular, to a temperature detection circuit, a display panel, and a display device.

BACKGROUND

With the development of information technology, human-computer interaction is increasingly applied in various scenarios. A display panel is one of the important components for obtaining information in the human-computer interaction process, and the related technology has been rapidly developed.

Characteristics of liquid crystal will drift with changes in temperature. At the same time, electrical characteristics of the various components in the display panel will change with the temperature. The electrical characteristics of the liquid crystal and the components in the display panel will directly affect the display effect. In other words, when the temperature of the display panel changes, the display effect will also change.

It should be noted that the information disclosed in the foregoing background section is only for enhancement of understanding of the background of the disclosure and therefore may include information that does not constitute prior art that is already known to those of ordinary skill in the art.

SUMMARY

According to one aspect of the present disclosure, there is provided a temperature detection circuit including:

an odd number of inverters coupled end to end in series to form a loop; and a plurality of switches, two terminals of each of which correspondingly coupled to two terminals of an even number of inverters, which are coupled continuously, among the odd number of inverters.

In an exemplary embodiment of the present disclosure, a temperature at a detection position is determined according to a frequency of a ring oscillator formed by the loop and a number of the inverters in the ring oscillator.

In an exemplary embodiment of the present disclosure, two terminals of each switch are correspondingly coupled to two terminals of two inverters coupled in series.

In an exemplary embodiment of the present disclosure, the number of the inverters is 2n+1, and the number of the switches is n, where n is a positive integer.

In an exemplary embodiment of the present disclosure, the temperature detection circuit further includes a control unit configured to control the plurality of switches to be turned on and off in response to a control signal.

In an exemplary embodiment of the present disclosure, the inverter includes one or more of: a CMOS inverter, an inverter composed of an NMOS transistor, and an inverter composed of a PMOS transistor.

According to one aspect of the present disclosure, there is provided a display panel including the temperature detection circuit of any of the above described.

In an exemplary embodiment of the present disclosure, the temperature detection circuit is integrated in a non-display area on an edge of the display panel in a loop-shaped arrangement.

In an exemplary embodiment of the present disclosure, the temperature detection circuit is integrated within a display area of the display panel.

According to one aspect of the present disclosure, there is provided a display device including the display panel according to any of the above described.

It should be understood that the above general description and the following detailed description are merely exemplary and explanatory and do not limit the present disclosure.

BRIEF DESCRIPTION OF THE DRAWINGS

The accompanying drawings herein are incorporated in and constitute a part of this specification, illustrate embodiments consistent with the present disclosure, and together with the description, serve to explain the principles of the disclosure. Apparently, the drawings in the following description are merely some embodiments of the present disclosure, and those skilled in the art can also obtain other drawings based on these drawings without any creative work. In the drawing.

DETAILED DESCRIPTION

Figure 1:
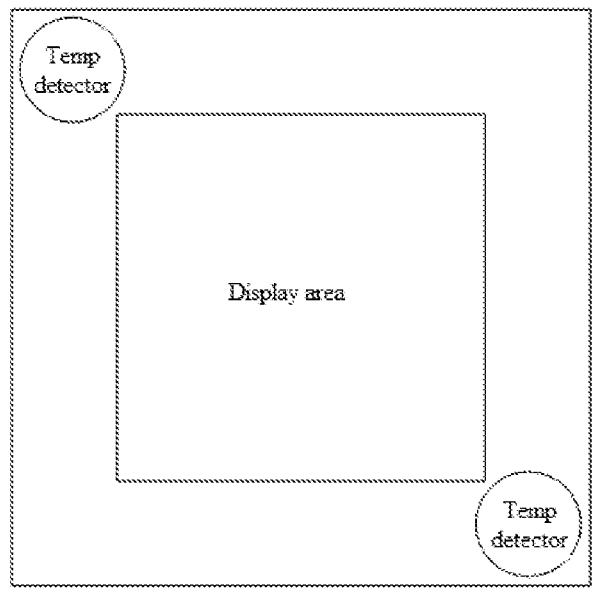
FIG. 1 shows a schematic diagram of a position of a temperature detector of a display panel in the related art.

Exemplary embodiments will now be described more fully with reference to the accompanying drawings. However, the exemplary embodiments can be implemented in various forms and should not be construed as being limited to the examples set forth herein. Rather, these embodiments are provided so that this disclosure will be more thorough and complete, and will fully convey the concept of the exemplary embodiments to those skilled in the art. For those skilled in the art. The features, structures, or characteristics described may be combined in any suitable manner in one or more embodiments. In the following description, numerous specific details are provided to provide a thorough understanding of the embodiments of the present disclosure. However, those skilled in the art will recognize that the technical solutions of the present disclosure may be practiced without one or more of the specific details, or that other methods, components, devices, steps, etc. may be employed. In other instances, well-known technical solutions have not been shown or described in detail to avoid obscuring aspects of the present disclosure.

Moreover, the drawings are merely schematic illustrations of the present disclosure and are not necessarily drawn to scale. The same reference numerals in the drawings denote the same or similar parts, and their repeated description will be omitted. Some of the block diagrams shown in the figures are functional parts and do not necessarily have to correspond to physically or logically separate parts. These functional parts may be implemented in software, or implemented in one or more hardware modules or integrated circuits, or implemented in different network and/or processor devices and/or microcontroller devices.

The display effect of the display panel may be affected by temperature. For example, when the temperature of certain areas of the display panel is too high, the display effect of the area may drop or even the area fails to display. Therefore, it is necessary to perform temperature detection on each area of the display panel. In addition, in some application fields of the display panel, the different display areas may be controlled to present different colors according to the temperatures of different display areas of the display panel, so as to achieve different display purposes. In this case, it is also necessary to perform temperature detection on each area of the display panel.

As shown in FIG. 1, temperature detectors of a display panel in the related art are located at opposite corners of the display panel. However, the temperature of each area on the panel may be different, and only opposite corners of the display panel have two temperature detectors, which cannot reflect the temperature state of the entire display panel.

In consideration of the above, the present disclosure proposes a new temperature detection circuit. Specifically, the temperature detection circuit includes: an odd number of inverters coupled end to end in series to form a loop; a plurality of switches, two terminals of each of which correspondingly coupled to two terminals of an even number of inverters, which are coupled continuously, among the odd-number of inverters.

In an exemplary embodiment of the present disclosure, the temperature detection circuit is configured to include an odd number of inverters and a plurality of switches that control the inverters. Based on the structure of the temperature detection circuit, the switch corresponding to the inverters for an area requiring temperature detection may be turned off, while the other switches may be turned on. On the one hand, it can realize temperature detection of any area on the display panel; on the other hand, since the temperature detection circuit of the present disclosure only includes an inverter and a switch, the circuit has a simple structure.

An exemplary operation of temperature detection of a temperature detection circuit according to an embodiment of the present disclosure will now be described with reference to FIG. 2. The circuit shown in FIG. 2 includes an inverter 1, an inverter 2, an inverter 3, an inverter 4, an inverter 5, a switch K1 and a switch K2. The inverter 1, the inverter 2, the inverter 3, the inverter 4 and the inverter 5 are sequentially coupled to each other in an end to end manner, and an input terminal of the inverter 1 is coupled to an output terminal of the inverter 5. Thus, the inverter 1, the inverter 2, the inverter 3, the inverter 4 and the inverter 5 can form a ring oscillation structure. In addition, the two terminals of the switch K1 are respectively coupled to the input terminal of the inverter 1 and an output terminal of the inverter 2, and the two terminals of the switch K2 are respectively coupled to an input terminal of the inverter 3 and an output terminal of the inverter 4. That is, the switch K1 can control the operation of the inverter 1 and the inverter 2, and the switch K2 can control the operation of the inverter 3 and the inverter 4.

A case where the switch K1 is turned on and the switch K2 is turned on is described as an example. In this case, the ring oscillation structure described in FIG. 2 includes the inverter 1, the inverter 2, and the inverter 5. In this case, the temperature of the area corresponding to the inverter 1 and the inverter 2 can be determined according to the outputted frequency and the correspondence between the outputted frequency and a temperature. Similarly, when the switch K1 is turned on and the switch K2 is turned off, the temperature of the area corresponding to the inverter 3 and the inverter 4 can be determined according to the outputted frequency and the correspondence between the outputted frequency and a temperature.

Figure 2:
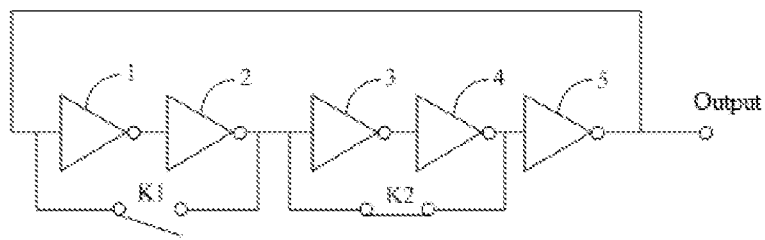
FIG. 2 shows a schematic diagram of a working principle of detecting a temperature with a switch-controlled inverter according to an exemplary embodiment of the present disclosure.

Those skilled in the art should understand that the circuit structure shown in FIG. 2 is intended to illustrate the working principle of the temperature detection circuit of the present disclosure, rather than limiting the disclosure to include five inverters and two switches. Other numbers of inverters and switches can be included. In addition, the corresponding connection of the two terminals of the switch to the two terminals of two inverters coupled in series is only an exemplary description, and the two terminals of the switch may be correspondingly coupled to two terminals of an even number of inverters coupled in series.

According to some embodiments of the present disclosure, the number of inverters in the temperature detection circuit described in the present disclosure may be 2n+1, and the number of switches may be n, where n is a positive integer. In this case, two terminals of each switch can be correspondingly coupled to two terminals of two inverters in series.

According to some embodiments of the present disclosure, the switch described in the present disclosure may be a switch element implemented by hardware, or may be a code for implementing a switch function through software, which is not particularly limited in this exemplary embodiment.

In addition, the temperature detection circuit of the present disclosure may further include a control unit, which may be configured to control the switch to be turned on and off in response to a control signal. The control signal may be sent by a R&D tester. In addition, the control signal may also be a signal generated by the display panel according to a triggering condition (e.g., operation duration, historical temperature, etc.).

In an exemplary embodiment of the present disclosure, the control unit may be integrated with the display module in the display panel, or may be a separately configured hardware module. In addition, the control unit may also be a functional unit implemented in the form of software. The functional unit for controlling the switch is not particularly limited in this exemplary embodiment.

Figure 3:
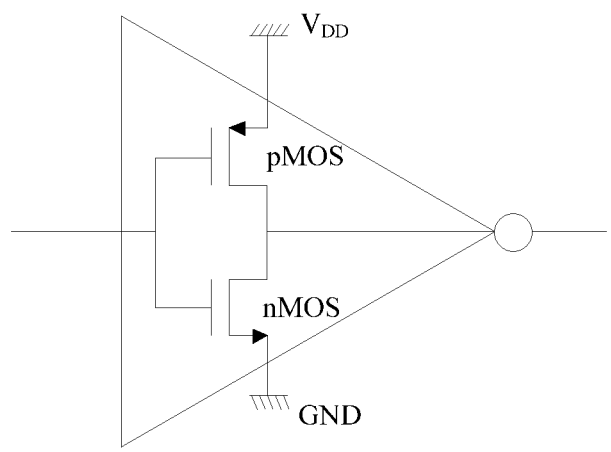
FIG. 3 shows a schematic diagram of a structure of an inverter according to an exemplary embodiment of the present disclosure.

FIG. 3 shows a schematic diagram of a structure of an inverter according to an exemplary embodiment of the present disclosure. The inverter shown in FIG. 3 is a CMOS inverter, including a PMOS transistor and an NMOS transistor. In addition, there is also a power supply voltage VDD and a ground GND associated with the CMOS inverter. In addition, the inverter of the exemplary embodiment of the present disclosure may further include an inverter composed of an NMOS transistor and/or an inverter composed of a PMOS transistor, and the present disclosure does not specifically limit the specific form of the inverter.

The above temperature detection circuit can be integrated on the display panel for performing temperature detection on different areas on the display panel.

Figure 4:
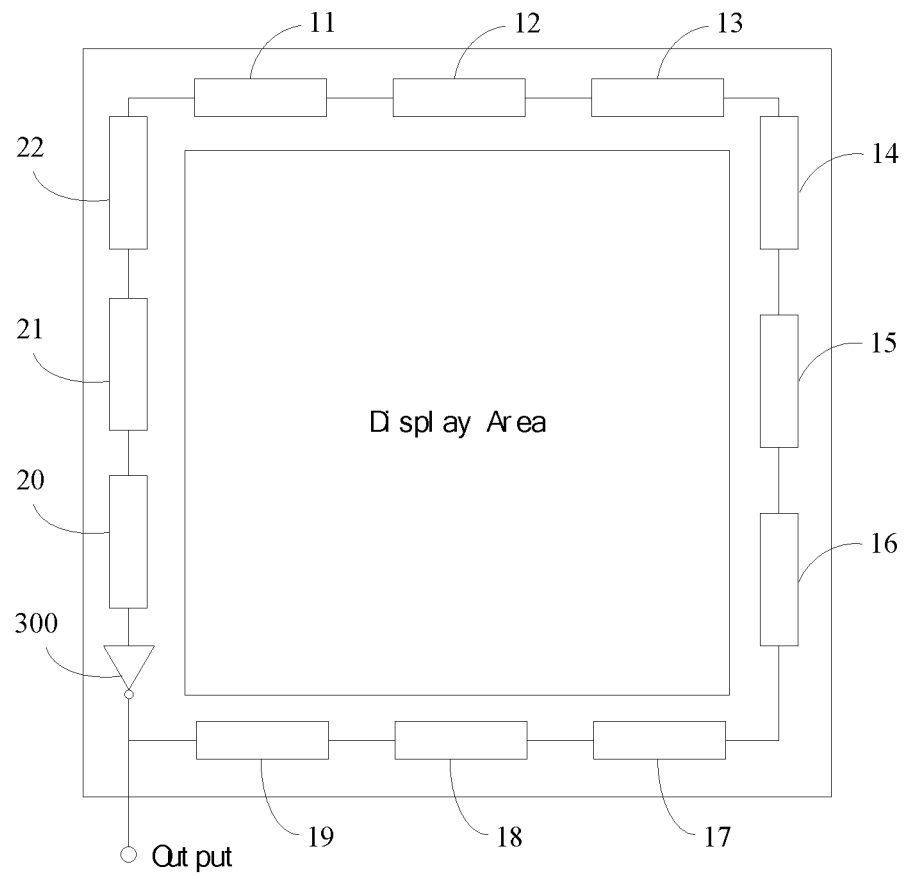
FIG. 4 shows a schematic diagram of an embodiment of a display panel according to an exemplary embodiment of the present disclosure.

Further, the present exemplary embodiment also provides a display panel including the above-described temperature detection circuit. FIG. 4 shows a schematic diagram of an embodiment of a display panel. Referring to FIG. 4, a temperature detection circuit is disposed in a non-display area (i.e., an edge area of a display panel) of a display panel. The temperature detection circuit may include an inverter group 11 to an inverter group 22 and an inverter 300. Specifically, the inverter group 11 to the inverter group 19 may be serially coupled in an end to end manner. One terminal of the inverter group 19 may be coupled to an output terminal of the inverter 300 and coupled to an output terminal of the temperature detection circuit. An input terminal of the inverter 300 may be coupled to one terminal of the inverter group 20. The inverter group 20 to the inverter group 22 may be sequentially coupled in an end to end manner, and one terminal of the inverter group 22 may be coupled to one terminal of the inverter group 11.

Each of the inverter group 11 to the inverter group 22 can include an inverter and a switch, and the number of the inverters in each inverter group is an even number. In this case, it can be ensured that the total number of the inverters in the temperature detection circuit is an odd number. It will be easily understood by those skilled in the art that the division of the inverter group 11 to the inverter group 22 is intended to facilitate the description. The idea of the present disclosure also includes other division manners.

Figure 5:
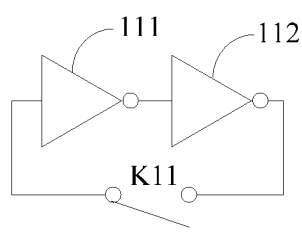
FIG. 5 shows a schematic diagram of an embodiment of an inverter group according to an exemplary embodiment of the present disclosure.

The inverter group is described by taking the inverter group 11 as an example. Referring to FIG. 5, the inverter group 11 may include an inverter 111, an inverter 112, and a switch K11, wherein the inverter 111 and the inverter 112 is coupled in series in an end to end manner, and two terminals of the switch K11 are respectively coupled to an input terminal of the inverter 111 and an output terminal of the inverter 112.

In this case, for the entire display panel, in a case where the area to be detected is the area corresponding to the inverter group 11, first, the switch K11 can be turned off, and the switches in other inverter groups can all be turned on. Next, the temperature of the area corresponding to the inverter group 11 is determined according to the frequency of the output signal of the output terminal and the number of inverters in the ring oscillator formed by the temperature detection circuit. In some embodiments of the present disclosure, a correspondence between the output signal frequencies of the output terminal, the numbers of inverters, and the temperatures may be provided. The correspondence may be summarized in advance to obtain a correspondence table. When the frequency of the output signal of the output terminal and the number of inverters are known, the correspondence table may be searched to obtain the temperature of the area to be detected. However, this way of determining the temperature is only an example, and other ways of determining the temperature of the area to be detected according to the output frequency also belong to the protection scope of the present disclosure.

It will be easily understood by those skilled in the art that the number of inverters shown in FIG. 5 is merely an example, and the number of inverters in each inverter group may also be other even number than two according to actual needs of temperature detection. The number and connection of the switches in the inverter group are also not limited to those described in FIG. 5. Those skilled in the art can easily think of other configurations of the switches, which is not limited in this exemplary embodiment.

In addition, the temperature detection circuit shown in FIG. 4 only includes one output terminal. In this case, it can avoid the problem that when multiple output terminals are provided for the multiple temperature detectors, the output terminals may influence each other to cause a large error in the detection. It should be noted that the position of the output terminal of the temperature detection circuit is not limited to the position shown in FIG. 4, and the output terminal of any inverter may also serve as the output terminal of the temperature detection circuit.

According to some embodiments of the present disclosure, a switch can also be configured for any inverter group. For example, when the area to be detected is the area corresponding to the inverter group 15, the switch corresponding to the inverter group 15 can be turned off, and all switches corresponding to other inverter groups can be turned on. Thus only the inverter group 15 and the inverter 300 are included in the temperature detection circuit. The temperature of the area corresponding to the inverter group 15 can be determined according to the frequency of the output signal and the number of inverters.

Figure 6:
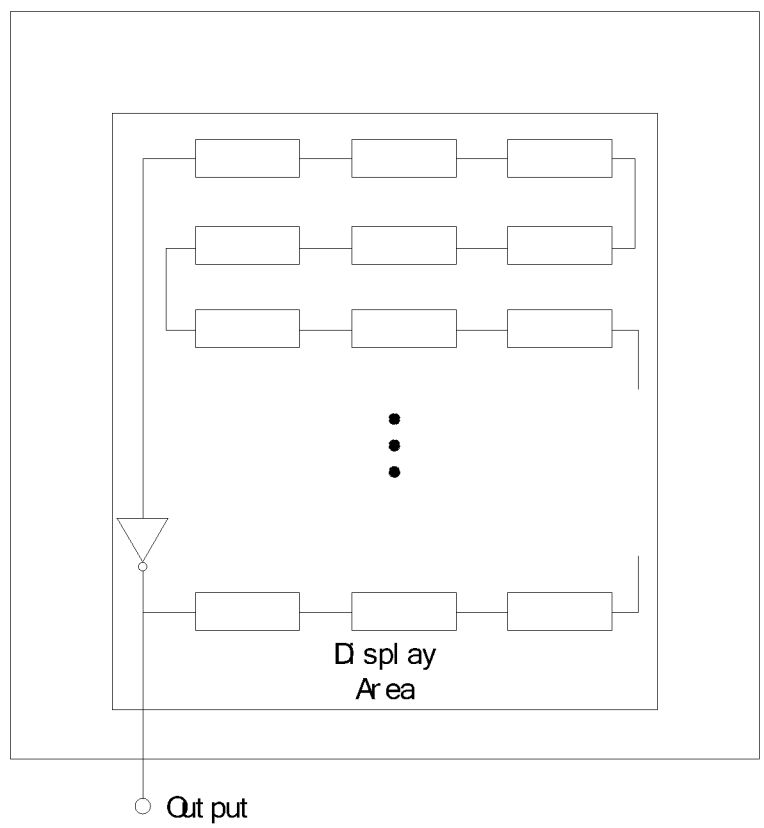
FIG. 6 shows a schematic diagram of still another embodiment of a display panel according to an exemplary embodiment of the present disclosure.

FIG. 6 shows a schematic diagram of still another embodiment of a display panel according to an exemplary embodiment of the present disclosure.

Compared to FIG. 4, in FIG. 6, the temperature detection circuit is disposed in the display area of the display panel. The specific manner of detecting the temperature is the same as the manner of detecting temperature shown in FIG. 4, which will not be described herein. It can be seen that the embodiment shown in FIG. 6 is only a solution for performing temperature detection on the display area of the display panel.

As those skilled in the art can easily understand, the present disclosure may further include a solution in which the temperature detection circuit is disposed over the entire area of the display panel. In addition, the present disclosure may also include a solution in which a temperature detection circuit is disposed on any designated area on the display panel to achieve temperature detection in the designated area.

Further, the present exemplary embodiment also provides a display device. The display device may include the above-described display panel. The display device may specifically be a product or a component having any display function, such as a liquid crystal panel, a liquid crystal display, a liquid crystal television, an organic electroluminescent display OLED panel, an OLED display, an OLED television, an electronic paper or a digital photo frame.

In the technical solutions provided by some embodiments of the present disclosure, the temperature detection circuit is configured to include an odd number of inverters and a plurality of switches that control the inverters. Based on the structure of the temperature detection circuit, the switch corresponding to the inverter for an area requiring temperature detection may be turned off, while the other switches may be turned on. On the one hand, it can realize temperature detection of any area on the display panel; on the other hand, since the temperature detection circuit of the present disclosure only includes an inverter and a switch, the circuit has a simple structure.

Other embodiments of the present disclosure will be apparent to those skilled in the art from consideration of the specification and practice of the present disclosure disclosed here. This application is intended to cover any variations, uses, or adaptations of the present disclosure following the general principles thereof and including the common knowledge and conventional technical means in the art not disclosed by the present disclosure. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A temperature detection circuit comprising:
an odd number of inverters coupled end to end in series to form a loop; and
a plurality of switches,
wherein the odd number of inverters are divided into a plurality of inverter groups coupled end to end in series and each comprising a same even number of inverters, and each of the switches is connected in parallel to a corresponding inverter group of the plurality of inverter groups with two terminals of the switch being connected to two terminals of the corresponding inverter group,
wherein a temperature at a detection position is determined according to correspondence between the temperature and a frequency of an output signal of a ring oscillator formed by the loop and a number of the inverters electrically coupled in the ring oscillator,
wherein the switch is configured so that when the switch is turned on, the two terminals of the corresponding inverter group are short-circuited through the switch and the corresponding inverter group is excluded from the ring oscillator, and when the switch is turned off, the corresponding inverter group is comprised in the ring oscillator,
wherein only one of the odd number of inverters is not connected in parallel to each of the inverter groups,
wherein each of the plurality of switches is configured to be turned on and off repeatably,
wherein the temperature detection circuit is configured so that when a temperature at a to-be-detected position is detected, the switch connected in parallel to the inverter group corresponding to the to-be-detected position is turned off, and other switches among the plurality of switches are all turned on.

2. The temperature detection circuit according to claim 1, wherein two terminals of each switch are correspondingly coupled to two terminals of two inverters coupled in series.

3. The temperature detection circuit according to claim 1, wherein the number of the inverters is 2n+1, and the number of the switches is n, where n is a positive integer.

4. The temperature detection circuit according to claim 1, further comprising:
a control unit configured to control the plurality of switches to be turned on and off in response to a control signal.

5. The temperature detection circuit according to claim 1, wherein the inverter comprises one or more of: a CMOS inverter, an inverter composed of an NMOS transistor, and an inverter composed of a PMOS transistor.

6. A display panel, comprising a temperature detection circuit, wherein the temperature detection circuit comprises:
an odd number of inverters coupled end to end in series to form a loop; and
a plurality of switches,
wherein the odd number of inverters are divided into a plurality of inverter groups coupled end to end in series and each comprising a same even number of inverters, and each of the switches is connected in parallel to a corresponding inverter group of the plurality of inverter groups with two terminals of the switch being connected to two terminals of the corresponding inverter group,
wherein a temperature at a detection position is determined according to correspondence between the temperature and a frequency of an output signal of a ring oscillator formed by the loop and a number of the inverters electrically coupled in the ring oscillator,
wherein the switch is configured so that when the switch is turned on, the two terminals of the corresponding inverter group are short-circuited through the switch and the corresponding inverter group is excluded from the ring oscillator, and when the switch is turned off, the corresponding inverter group is comprised in the ring oscillator,
wherein only one of the odd number of inverters is not connected in parallel to each of the inverter groups,
wherein each of the plurality of switches is configured to be turned on and off repeatably,
wherein the temperature detection circuit is configured so that when a temperature at a to-be-detected position is detected, the switch connected in parallel to the inverter group corresponding to the to-be-detected position is turned off, and other switches among the plurality of switches are all turned on.

7. The display panel according to claim 6, wherein the temperature detection circuit is integrated within a display area of the display panel.

8. The display panel according to claim 6, wherein two terminals of each switch are correspondingly coupled to two terminals of two inverters coupled in series.

9. The display panel according to claim 6, wherein the number of the inverters is 2n+1, and the number of the switches is n, where n is a positive integer.

10. The display panel according to claim 6, wherein the temperature detection circuit further comprises:
a control unit configured to control the plurality of switches to be turned on and off in response to a control signal.

11. The display panel according to claim 6, wherein the inverter comprises one or more of: a CMOS inverter, an inverter composed of an NMOS transistor, and an inverter composed of a PMOS transistor.

12. A display device, comprising a display panel, wherein the display panel has a temperature detection circuit comprising:
an odd number of inverters coupled end to end in series to form a loop; and
a plurality of switches,
wherein the odd number of inverters are divided into a plurality of inverter groups coupled end to end in series and each comprising a same even number of inverters, and each of the switches is connected in parallel to a corresponding inverter group of the plurality of inverter groups with two terminals of the switch being connected to two terminals of the corresponding inverter group,
wherein a temperature at a detection position is determined according to correspondence between the temperature and a frequency of an output signal of a ring oscillator formed by the loop and a number of the inverters electrically coupled in the ring oscillator, wherein the switch is configured so that when the switch is turned on, the two terminals of the corresponding inverter group are short-circuited through the switch and the corresponding inverter group is excluded from the ring oscillator, and when the switch is turned off, the corresponding inverter group is comprised in the ring oscillator, wherein only one of the odd number of inverters is not connected in parallel to each of the inverter groups, wherein each of the plurality of switches is configured to be turned on and off repeatably, wherein the temperature detection circuit is configured so that when a temperature at a to-be-detected position is detected, the switch connected in parallel to the inverter group corresponding to the to-be-detected position is turned off, and other switches among the plurality of switches are all turned on.

13. The display device according to claim 12, wherein the temperature detection circuit is integrated in a non-display area on an edge of the display panel in a loop-shaped arrangement.

14. The display device according to claim 12, wherein the temperature detection circuit is integrated within a display area of the display panel.

15. The display device according to claim 12, wherein two terminals of each switch are correspondingly coupled to two terminals of two inverters coupled in series.

16. The display device according to claim 12, wherein the number of the inverters is 2n+1, and the number of the switches is n, where n is a positive integer.

17. The display device according to claim 12, wherein the temperature detection circuit further comprises:

a control unit configured to control the plurality of switches to be turned on and off in response to a control signal.

18. The display device according to claim 12, wherein the inverter comprises one or more of: a CMOS inverter, an inverter composed of an NMOS transistor, and an inverter composed of a PMOS transistor.

* * * * *